(12) United States Patent
Zhang et al.

(10) Patent No.: US 12,009,682 B2
(45) Date of Patent: Jun. 11, 2024

(54) LOAD ACCESS DETECTION METHOD, SWITCH CIRCUIT, AND BATTERY MANAGEMENT SYSTEM

(71) Applicant: CONTEMPORARY AMPEREX TECHNOLOGY CO., LIMITED, Fujian (CN)

(72) Inventors: Xu Zhang, Ningde (CN); Hang Ma, Ningde (CN); Xingchang Wang, Ningde (CN)

(73) Assignee: CONTEMPORARY AMPEREX TECHNOLOGY CO., LIMITED, Ningde (CN)

(*) Notice: Subject to any disclaimer, the term of this patent is extended or adjusted under 35 U.S.C. 154(b) by 502 days.

(21) Appl. No.: 17/479,505

(22) Filed: Sep. 20, 2021

(65) Prior Publication Data

US 2022/0006308 A1    Jan. 6, 2022

Related U.S. Application Data

(63) Continuation of application No. PCT/CN2020/133455, filed on Dec. 2, 2020.

(30) Foreign Application Priority Data

Apr. 9, 2020 (CN) .......................... 202010274684.X (51) Int. Cl.
*H02J 7/00* (2006.01)
*B60L 3/00* (2019.01)
(Continued)

(52) U.S. Cl.
CPC .......... *H02J 7/0047* (2013.01); *B60L 3/0046* (2013.01); *B60L 3/12* (2013.01); *B60L 58/12* (2019.02);
(Continued)

(58) Field of Classification Search
None
See application file for complete search history.

(56) References Cited

U.S. PATENT DOCUMENTS

2004/0185317 A1* 9/2004 Aoyagi ............. H01M 8/04567
429/432
2008/0185999 A1* 8/2008 Matsukawa ......... H02J 7/00712
320/166
(Continued)

FOREIGN PATENT DOCUMENTS

| CN | 102166959 A | 8/2011 |
| CN | 104553813 A | 4/2015 |

(Continued)

*Primary Examiner* — Arun C Williams
(74) *Attorney, Agent, or Firm* — Scully, Scott, Murphy & Presser, P.C.

(57) ABSTRACT

A load access detection method, a switch circuit, and a battery management system, relating to the field of circuit technology. The load access detection method includes: detecting a voltage at a first detection point; detecting a voltage at a second detection point; if a voltage difference between the voltage at the first detection point and the voltage at the second detection point is less than or equal to a preset voltage threshold, controlling a switch circuit to enter a pre-charging mode, and pre-charging a load capacitor in the load circuit through the battery pack, where a charging current of the switch circuit in the pre-charging mode is less than a charging current of the switch circuit in a charging mode.

20 Claims, 3 Drawing Sheets

(51) Int. Cl.
    *B60L 3/12*          (2006.01)
    *B60L 58/12*        (2019.01)
    *G01R 31/3835*    (2019.01)
    *H02J 7/34*         (2006.01)

(52) U.S. Cl.
    CPC .... *G01R 31/3835* (2019.01); *H02J 7/007182* (2020.01); *H02J 7/345* (2013.01)

(56) References Cited

U.S. PATENT DOCUMENTS

| | | |
|---|---|---|
| 2010/0127663 A1 | 5/2010 | Furukawa et al. |
| 2011/0210746 A1 | 9/2011 | Yugou et al. |
| 2012/0280659 A1 | 11/2012 | Xu et al. |
| 2013/0083001 A1* | 4/2013 | Jeong .................. G09G 3/3266 345/82 |
| 2013/0175857 A1 | 7/2013 | Shreevani et al. |
| 2013/0337294 A1 | 12/2013 | Achhammer |
| 2017/0166065 A1* | 6/2017 | Hong ....................... H02J 7/00 |

FOREIGN PATENT DOCUMENTS

| | | |
|---|---|---|
| CN | 104865519 A | 8/2015 |
| CN | 110239391 A | 9/2019 |
| CN | 111301173 A | 6/2020 |
| DE | 102011013394 A1 | 9/2012 |
| EP | 2361799 A2 | 8/2011 |
| JP | 2019161816 A | 9/2019 |

* cited by examiner

LOAD ACCESS DETECTION METHOD, SWITCH CIRCUIT, AND BATTERY MANAGEMENT SYSTEM

CROSS-REFERENCING TO RELATED APPLICATIONS

This application is a continuation of International Application No. PCT/CN2020/133455, filed on Dec. 2, 2020, which claims priority to Chinese Patent Application No. CN202010274684.X, filed on Apr. 9, 2020. The disclosures of the aforementioned applications are hereby incorporated by reference in their entireties.

FIELD OF TECHNOLOGY

The embodiments of this application relate to the field of circuit technology, and in particular, to a load access detection method, a switch circuit, and a battery management system.

BACKGROUND

With the development of battery technology, electric vehicles have become the development trend of the industry. As an energy core of the electric vehicle, a power battery pack is a key component of the electric vehicle.

In related technologies, since a charging and discharging field-effect transistor in the battery pack is in a normally closed state, when the battery pack is connected to a vehicle body, ignition and ablation may occur in an interface between a vehicle body base and the battery pack, which is a potential safety hazard.

SUMMARY

The purpose of the embodiments of this application is to provide a load access detection method, a switch circuit, and a battery management system, so as to avoid an ablation problem when igniting that occur when the battery pack is connected to the load circuit.

To resolve the foregoing technical problems, the implementations of this application provide a load access detection method, including: detecting a voltage at a first detection point, where the first detection point is electrically connected to a positive electrode of a battery group in a battery pack through a bridging resistor; detecting a voltage at a second detection point, where the second detection point is short-circuited with the first detection point when the battery pack is connected to a load circuit; if a voltage difference between the voltage at the first detection point and the voltage at the second detection point is less than or equal to a preset voltage threshold, controlling a switch circuit to enter a pre-charging mode, and pre-charging a load capacitor in the load circuit through the battery pack, where a charging current of the switch circuit in the pre-charging mode is less than a charging current of the switch circuit in a charging mode.

The implementations of this application also provide a battery management system, including: a detection unit, configured to detect a voltage at a first detection point, where the first detection point is electrically connected to a positive electrode of a battery group in a battery pack through a bridging resistor, and the detection unit is further configured to detect a voltage at a second detection point, where the second detection point is short-circuited with the first detection point when the battery pack is connected to a load circuit; and a processing unit, configured to control a switch circuit to enter a pre-charging mode, and pre-charge a load capacitor in the load circuit through the battery pack when a voltage difference between the voltage at the first detection point and the voltage at the second detection point is less than or equal to a preset voltage threshold, where a charging current of the switch circuit in the pre-charging mode is less than a charging current of the switch circuit in a charging mode.

The implementations of this application also provide a switch circuit, including: a first switch, a second switch, and a third switch; where the first switch is connected in parallel with the second switch; the first switch is connected in series with the third switch; and the second switch is connected in series with the third switch through at least one resistor; the switch circuit is configured to enter a pre-charging mode according to control of the battery management system; and the switch circuit is further configured to pre-charge a load capacitor in the load circuit through the battery pack, where a charging current of the switch circuit in the pre-charging mode is less than a charging current of the switch circuit in a charging mode.

The implementations of this application also provide a load access detection method applied to the foregoing switch circuit, and the method includes: entering, by the switch circuit, a pre-charging mode according to control of a battery management system; pre-charging, by the switch circuit, a load capacitor in a load circuit through a battery pack, where a charging current of the switch circuit in the pre-charging mode is less than a charging current of the switch circuit in a charging mode; and the entering, by the switch circuit, a pre-charging mode according to control of a battery management system includes: controlling, by the battery management system, the switch circuit to enter the pre-charging mode if a voltage difference between a voltage at a first detection point and a voltage at a second detection point is less than or equal to a preset voltage threshold; detecting, by a battery management system, the voltage at the first detection point, where the first detection point is electrically connected to a positive electrode of a battery group in a battery pack through a bridging resistor; and detecting, by the battery management system, the voltage at the second detection point, where the second detection point is short-circuited with the first detection point when the battery pack is connected to a load circuit.

The implementations of this application also provide a load access detection system, which includes the foregoing battery management system and switch circuit.

Compared with related technologies, in the implementations of this application, the voltage at the first detection point is first detected, where the first detection point is electrically connected to the positive electrode of the battery group in the battery pack through the bridging resistor, and then the voltage at the second detection point is detected. When the battery pack is connected to the load circuit, the second detection point is short-circuited with the first detection point. And therefore, if the voltage difference between the voltage at the first detection point and the voltage at the second detection point is less than or equal to the preset voltage threshold, it indicates that the battery pack is connected to the load circuit. The switch circuit is controlled to enter the pre-charging mode, and the load capacitor in the load circuit is pre-charged through the battery pack. The charging current of the switch circuit in the pre-charging mode is less than the charging current of the switch circuit in the charging mode, so as to avoid the ablation problem when igniting that occur when the battery pack is connected to the load circuit.

In addition, the if a voltage difference between the voltage at the first detection point and the voltage at the second detection point is less than or equal to a preset voltage threshold, controlling a switch circuit to enter a pre-charging mode, and pre-charging a load capacitor in the load circuit through the battery pack includes: if the voltage difference between the voltage at the first detection point and the voltage at the second detection point is less than or equal to the preset voltage threshold within a first preset period, controlling the switch circuit to enter the pre-charging mode, and pre-charging the load capacitor in the load circuit through the battery pack. In this implementation, influence of voltage instability on the load access detection is avoided, and voltage detection stabilization is realized.

In addition, the switch circuit includes a first switch, a second switch, and a third switch, and the method includes: turning off the second switch, turning on a charging direction of the first switch, and turning on a charging direction of the third switch, so as to form the charging mode of the switch circuit; and turning off the first switch, turning on a charging direction of the second switch, and turning on the charging direction of the third switch, so as to form the pre-charging mode of the switch circuit; where the first switch is connected in parallel with the second switch; the first switch is connected in series with the third switch; and the second switch is connected in series with the third switch through at least one resistor. This implementation provides a specific structure of the switch circuit and a formation of the pre-charging mode and the charging mode of the switch circuit.

In addition, the controlling a switch circuit to enter a pre-charging mode, and pre-charging a load capacitor in the load circuit through the battery pack includes: controlling the switch circuit to maintain the pre-charging mode within a second preset period, and pre-charging the load capacitor through the battery pack. In this implementation, a time for controlling the switch circuit to maintain the pre-charging mode is the second preset period, so as to control the battery pack to pre-charge the load capacitor for the second preset period.

In addition, the method further includes: determining that an access fault occurs if the voltage difference between the voltage at the first detection point and the voltage at the second detection point is greater than the voltage threshold.

In addition, the processing unit is configured to control the switch circuit to enter a pre-charging mode, and pre-charge a load capacitor in the load circuit through the battery pack when a voltage difference between the voltage at the first detection point and the voltage at the second detection point is less than or equal to a preset voltage threshold within a first preset time period.

In addition, the switch circuit includes a first switch, a second switch, and a third switch, where the first switch is connected in parallel with the second switch; the first switch is connected in series with the third switch; and the second switch is connected in series with the third switch through at least one resistor; the processing unit is specifically configured to: turn off the first switch, turn on a charging direction of the second switch, and turn on a charging direction of the third switch, so as to form the pre-charging mode of the switch circuit; and the processing unit is specifically configured to: turn off the second switch, turn on a charging direction of the first switch, and turn on the charging direction of the third switch, so as to form the charging mode of the switch circuit.

In addition, the processing unit is configured to control the switch circuit to maintain the pre-charging mode within a second preset period, and pre-charging the load capacitor through the battery pack.

In addition, the processing unit is further configured to determine that an access fault occurs if the voltage difference between the voltage at the first detection point and the voltage at the second detection point is greater than the voltage threshold.

In addition, that the switch circuit is configured to enter the pre-charging mode according to control of the battery management system is specifically that: the first switch is configured to be turned off, a charging direction of the second switch is configured to be turned on, and a charging direction of the third switch is configured to be turned on, so as to form the pre-charging mode of the switch circuit.

In addition, the switch circuit is further configured that: the second switch is configured to be turned off, a charging direction of the first switch is configured to be turned on, and the charging direction of the third switch is configured to be turned on, so as to form the charging mode of the switch circuit.

BRIEF DESCRIPTION OF THE DRAWINGS

One or more embodiments are used as examples to be described by figures in corresponding drawings. These exemplary descriptions do not constitute a limitation on the embodiments. Elements with the same reference numerals in the drawings are denoted as similar elements. Unless otherwise stated, the figures in the drawings do not constitute a scale limitation.

DETAILED DESCRIPTION OF THE EMBODIMENTS

To make objectives, technical solutions, and advantages of the embodiments of this application clearer, the following describes the embodiments of this application in detail with reference to the accompanying drawings. However, a person of ordinary skill in the art may understand that in each embodiment of this application, many technical details are proposed to enable the reader to better understand this application. However, even without these technical details and various changes and modifications based on the following implementations, the technical solution claimed in this application may also be realized. The following division of the embodiments are for convenience of description, and should not constitute any limitation on the specific implementation of this application, and the embodiments may be combined with each other without contradiction.

Figure 1:
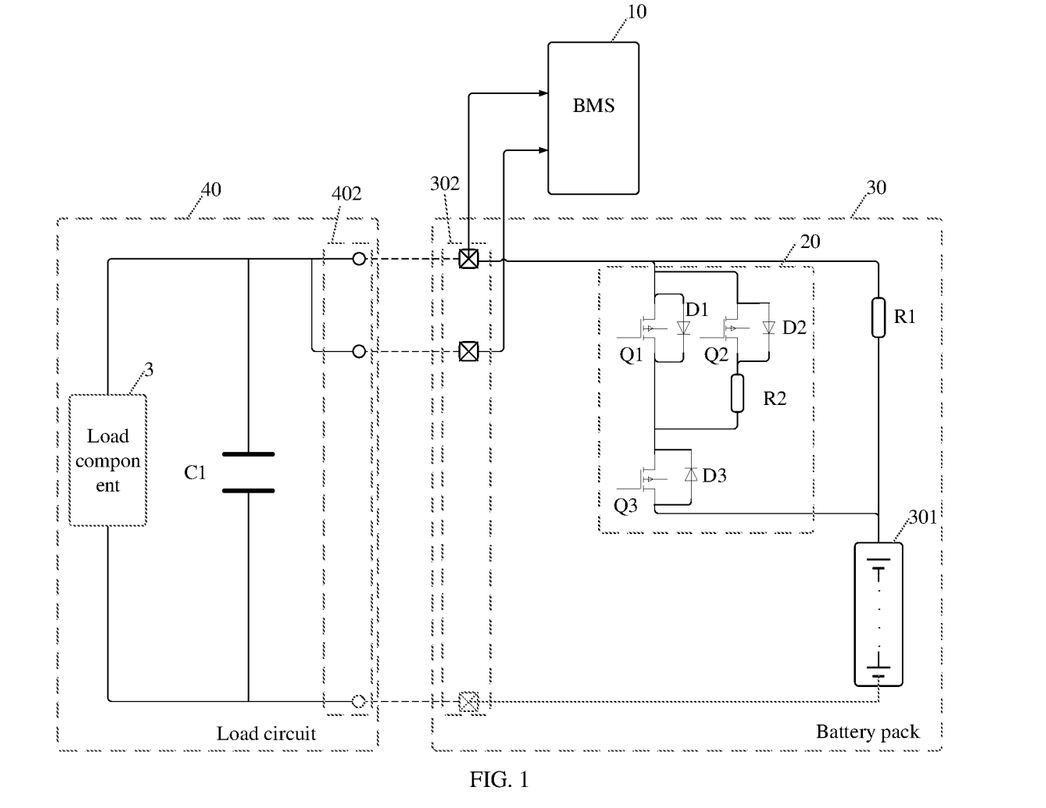
FIG. 1 is a schematic diagram of circuits of a load access detection system according to a first implementation of this application.

As shown in FIG. 1, FIG. 1 is an example diagram of a circuit structure of the load access detection system to which the load access detection method is applied of this embodiment, and the load access detection system includes at least a battery management system (BMS) 10 and a switch circuit 20. A battery pack 30 and a load circuit 40 are also included in FIG. 1.

The battery management system 10 is used at least to detect and manage the battery pack 30.

The switch circuit 20 includes a first switch, a second switch, and a third switch. The second switch and the third switch are connected in series through at least one resistor (for example, the second switch and the third switch are connected in series through a resistor R2 in FIG. 1), the first switch is connected in parallel with the second switch, and the first switch is connected in series with the third switch. In an example, the switch circuit 20 may be a part of the battery pack 30, but it is not limited to this. The switch circuit 20 may also be arranged outside the battery pack 30.

In an example, the first switch, the second switch, and the third switch may be field-effect transistors. In an example, the first switch, the second switch, and the third switch all include MOS transistors and diodes connected in parallel (which is used as an example in the figure). Specifically, the first switch includes a MOS transistor Q1 and a diode D1, the second switch includes a MOS transistor Q2 and a diode D2, and the third switch includes a MOS transistor Q3 and a diode D3. Optionally, the switch may be a switch device such as an insulated gate bipolar transistor (IGBT) or a metal-oxide semiconductor field-effect transistor (MOSFET).

The battery pack 30 includes at least a battery group 301 and a battery pack interface 302, and the battery group 301 is charged and discharged through the switch circuit 20. The switch circuit 20 may turn on a charging circuit or a discharging circuit under the control of the BMS10.

The BMS10, the switch circuit 20, and the battery pack 30 may be combined with each other based on application scenarios, which is not limited in the embodiments of this application.

The load circuit 40 includes at least a load capacitor C1, a load component 401, and a load interface 402.

The battery pack interface 302 and the load interface 402 are matched. Optionally, the battery pack interface 302 is inserted into the load interface 402, so that the battery pack 30 is connected to the load circuit 40.

Figure 2:
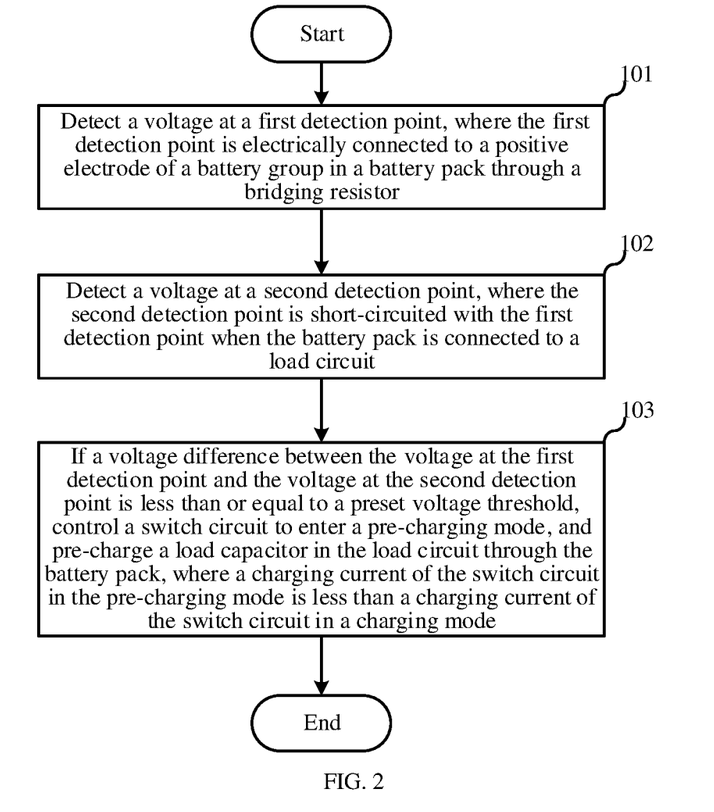
FIG. 2 is a specific flowchart of a load access detection system according to a first implementation of this application.

The load access detection method of this embodiment is described in detail below with reference to the circuit structure diagram of the load access detection system in FIG. 1. Please refer to FIG. 2, FIG. 2 is a specific flowchart of the load access detection method performed by the BMS.

Step 101: Detect a voltage at a first detection point, where the first detection point is electrically connected to a positive electrode of a battery group in a battery pack through a bridging resistor.

Step 102: Detect a voltage at a second detection point, where the second detection point is short-circuited with the first detection point when the battery pack is connected to a load circuit.

Step 103: If a voltage difference between the voltage at the first detection point and the voltage at the second detection point is less than or equal to a preset voltage threshold, control a switch circuit to enter a pre-charging mode, and pre-charge a load capacitor in the load circuit through the battery pack, where a charging current of the switch circuit in the pre-charging mode is less than a charging current of the switch circuit in a charging mode.

The first detection point is electrically connected to the positive electrode of the battery group in the battery pack through the bridging resistor. The bridging resistor can ensure that the battery pack will not discharge high current through the bridging resistor, which reduces power consumption and ensures safety. Optionally, a resistance value of the bridging resistor may be megohms.

For example, in FIG. 1, the first detection point is located in the battery pack interface 302, and the BMS10 detects the voltage at the first detection point.

For example, in FIG. 1, the second detection point is located in the battery pack interface 302. Optionally, the second detection point may be suspended or connected to ground through at least one resistor, and the second detection point may also be referred to as a load access detection point.

When the battery pack 30 is connected to the load circuit 40, namely, when the battery pack interface 302 and the load interface 402 are connected to each other, the second detection point may be short-circuited with the first detection point through the load interface 402.

The BMS10 detects the voltage at the second detection point. Since when the battery pack 30 is connected to the load circuit 40, the second detection point is short-circuited with the first detection point. Theoretically, the voltage at the first detection point is the same as the voltage at the second detection point. However, there are actually measurement errors. To avoid misjudgment, a voltage threshold may be set. If the voltage at the first detection point and the voltage at the second detection point are less than or equal to the preset voltage threshold, it may be considered that the battery pack 30 is connected to the load circuit 40. A positive pole of the battery group in the battery pack is led out through the bridging resistor, so that the BMS10 can detect whether the battery pack 30 is connected to the load circuit 40.

Specifically, when the battery pack 30 is connected to the load circuit 40, the voltage at the first detection point and the voltage at the second detection point should be approximately equal. The voltage threshold is preset in the BMS10, and the voltage difference between the voltage at the first detection point and the voltage at the second detection point should be less than the voltage threshold, for example, the voltage difference is less than or equal to 1 V. After obtaining the voltage at the first detection point and the voltage at the second detection point, the BMS10 calculates the voltage difference between the voltage at the first detection point and the voltage at the second detection point. If the calculated voltage difference is negative, an absolute value of the voltage difference may be taken as the voltage difference; then the BMS10 determines whether the voltage difference is less than or equal to the preset voltage threshold; if the voltage difference is less than or equal to the preset voltage threshold, the BMS10 controls the switch circuit 20 to enter the pre-charging mode to pre-charge the load capacitor C1 in the load circuit 40; and if the voltage difference is greater than the preset voltage threshold, the BMS10 controls the first switch, the second switch, and the third switch of the switch circuit 20 to maintain turned off. In addition, if the battery pack 30 is not connected to the load circuit 40, the voltage at the first detection point is much greater than the voltage at the second detection point, so that the BMS10 can recognize that the battery pack 30 is not connected to the load circuit 40. The first switch, the second switch, and the third switch in the battery pack 30 are controlled to maintain turned off, thereby avoiding a safety problem of external discharge of the battery pack 30.

In this embodiment, the switch circuit 20 has three modes, which are respectively: a pre-charging mode, a charging mode, and a discharging mode. Specifically: in the pre-charging mode, the first switch is turned off, and a charging direction of the second switch is turned on, a charging direction of the third switch is turned on; in the charging mode, the second switch is turned off, a charging direction of the first switch is turned on, and the charging direction of the third switch is turned on; and in the discharging mode, the second switch is turned off, a discharging direction of the first switch is turned on, and a discharging direction of the third switch is turned on. If both the first switch and the third switch are field-effect transistors, the first switch and the third switch may be collectively referred to as switch field-effect transistors.

In an example, if the voltage difference between the voltage at the first detection point and the voltage at the second detection point is less than or equal to the preset voltage threshold within a first preset period, the BMS10 controls the switch circuit 20 to enter the pre-charging mode, and pre-charge the load capacitor C1 in the load circuit 40. Specifically, when the battery pack 30 is connected to the load circuit 40, the BMS10 continuously detects and compares the voltage at the first detection point with the voltage at the second detection point during the first preset time period. If the voltage difference is always less than or equal to the preset voltage threshold within the first preset time period, the BMS10 controls the switch circuit 20 to enter the pre-charging mode, and pre-charges the load capacitor C1 in the load circuit 40 through the battery pack 30. In the embodiments of this application, the first preset time period is not specifically limited, for example, it may be 2 S. The first preset time period is set to avoid influence of voltage instability on the load access detection, and realize voltage detection stabilization.

In this embodiment, the BMS10 controls the switch circuit 20 to enter the pre-charging mode, namely, controlling the first switch to maintain turned off, controlling the charging direction of the second switch to maintain turned on, and controlling the charging direction of the third switch to maintain turned on. At this time, the battery pack 30 is connected to the load capacitor C1 through the second switch, the resistor R2, and the third switch, and the battery pack 30 pre-charges the load capacitor C1. Due to the existence of the resistor R2, the charging current of the switch circuit 20 in the pre-charging mode is less than the charging current of the switch circuit in the charging mode. Optionally, the BMS10 may control the switch circuit 20 to maintain the pre-charging mode within the second preset period, and pre-charge the load capacitor C1 through the battery pack 30, namely, a time for controlling the switch circuit 20 to maintain the pre-charging mode is the second preset period, so as to control the battery pack 30 to pre-charge the load capacitor C1 for the second preset period. The second preset period may be set according to a capacitance of the load capacitor C1.

In an example, the BMS10 controls the switch circuit 20 to end the pre-charging mode after the load capacitor C1 finishes charging, and controls the switch circuit 20 to enter the charging mode or the discharging mode according to a currently connected circuit; for example, when the battery pack 30 is connected to the electric vehicle, the BMS10 controls the switch circuit 2 to enter the discharging mode, and at this time, the battery pack 30 supplies power to a load component 3 in the load circuit 40 through discharging directions of the first switch and the third switch; when the battery pack 30 is connected to a charging pile, the BMS10 controls the switch circuit 20 to enter the charging mode, and at this time, the charging pile charges the battery pack 30 through charging directions of the first switch and the third switch.

In this embodiment, when the voltage difference between the voltage at the first detection point and the voltage at the second detection point in the BMS10 is greater than the preset voltage threshold, it is determined that a connection failure occurs, namely, the battery pack 30 fails to connect to the load circuit 40. The access fault may be a lose connectivity fault in the load circuit 40.

Specifically, when the battery pack 20 is connected to the load circuit 30, after obtaining the voltage at the first detection point and the voltage at the second detection point, the BMS10 calculates the difference between the voltage at the first detection point and the voltage at the second detection point. If the voltage difference is greater than the preset voltage threshold, it is determined that the battery pack 30 fails to connect to the load circuit 40, and the BMS10 controls the first switch, the second switch, and the third switch in the switch circuit 20 to maintain turned off. Optionally, after determining that the battery pack 30 fails to connect to the load circuit 40, the BMS10 may send a fault prompt message to a display screen of the electric vehicle.

Compared with related technologies, in this implementation, the voltage at the first detection point is first detected, where the first detection point is electrically connected to the positive electrode of the battery group in the battery pack through the bridging resistor, and then the voltage at the second detection point is detected. When the battery pack is connected to the load circuit, the second detection point is short-circuited with the first detection point. And therefore, if the voltage difference between the voltage at the first detection point and the voltage at the second detection point is less than or equal to the preset voltage threshold, it indicates that the battery pack is connected to the load circuit. The switch circuit is controlled to enter the pre-charging mode, and the load capacitor in the load circuit is pre-charged through the battery pack. The charging current of the switch circuit in the pre-charging mode is less than the charging current of the switch circuit in the charging mode, so as to avoid the ablation problem when igniting that occur when the battery pack is connected to the load circuit. In addition, it can avoid generation of a large surge current from impacting the switch circuit, and ensure a service life of the switch circuit, thereby improving safety.

A second implementation of this application provides a battery management system for executing the method in the foregoing embodiment. Please refer to FIG. 1, FIG. 1 is an example diagram of a circuit structure of a load access detection system to which a battery management system of this embodiment is applied. Please refer to FIG. 3, the battery management system BMS10 includes a detection unit 101 and a processing unit 102.

Figure 3:
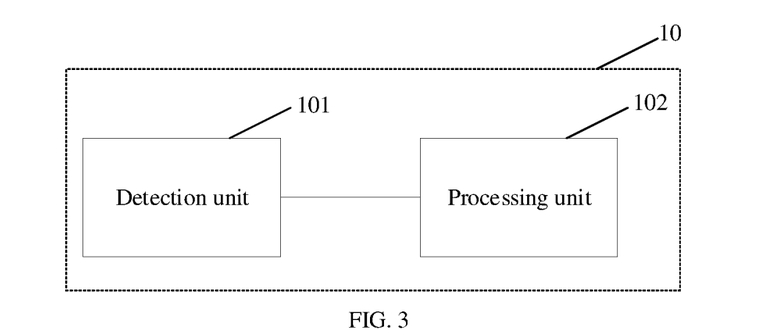
FIG. 3 is a structural diagram of modules of a battery management system according to a second implementation of this application.

The detection unit 101 is configured to detect a voltage at a first detection point, where the first detection point is electrically connected to a positive electrode of a battery group in a battery pack through a bridging resistor.

The detection unit 101 is further configured to detect a voltage at a second detection point, where the second detection point is short-circuited with the first detection point when the battery pack is connected to a load circuit.

The processing unit 102 is configured to control a switch circuit 20 to enter a pre-charging mode, and pre-charge a load capacitor C1 in the load circuit 40 through the battery pack 30 when a voltage difference between the voltage at the first detection point and the voltage at the second detection point is less than or equal to a preset voltage threshold, where a charging current of the switch circuit 20 in the pre-charging mode is less than a charging current of the switch circuit 20 in a charging mode. Optionally, there is a preset voltage threshold in the BMS10.

Optionally, the processing unit 102 is configured to control the switch circuit 20 to enter a pre-charging mode, and pre-charge a load capacitor C1 in the load circuit 40 if a voltage difference between the voltage at the first detection point and the voltage at the second detection point is less than or equal to a preset voltage threshold within a first preset time period. Specifically, when the battery pack 30 is connected to the load circuit 40, the BMS10 continuously detects the voltage at the first detection point and the voltage at the second detection point. If the voltage difference between the voltage at the first detection point and the voltage at the second detection point is always less than or equal to the preset voltage threshold within the first preset time period, the BMS10 controls the switch circuit 20 to enter the pre-charging mode, and pre-charges the load capacitor C1 in the load circuit 40 through the battery pack 30. In the embodiments of this application, the first preset time period is not specifically limited, for example, it may be 2 S. The first preset time period is set to avoid influence of voltage instability on the load access detection, and realize voltage detection stabilization.

The BMS10 controls the switch circuit 20 to enter the pre-charging mode, namely, controlling the first switch to maintain turned off, controlling the charging direction of the second switch to maintain turned on, and controlling the charging direction of the third switch to maintain turned on. At this time, the battery pack 30 is connected to the load capacitor C1 through the second switch, the resistor R2, and the third switch, to pre-charge the load capacitor C1. Due to the existence of the resistor R2, the charging current of the switch circuit 20 in the pre-charging mode is less than the charging current of the switch circuit in the charging mode. Optionally, the BMS10 may control the switch circuit 20 to maintain the pre-charging mode within the second preset period, and pre-charge the load capacitor C1, namely, a time for controlling the switch circuit 20 to maintain the pre-charging mode is the second preset period, so as to control the battery pack 30 to pre-charge the load capacitor C1 for the second preset period. Optionally, the second preset period may be set according to a capacitance of the load capacitor C1.

Optionally, the processing unit 102 is further configured to: if the voltage difference between the voltage at the first detection point and the voltage at the second detection point is greater than the preset voltage threshold, determine that a connection failure occurs, namely, the battery pack 30 fails to connect to the load circuit 40. Specifically, when the battery pack 30 is connected to the load circuit 40, after obtaining the voltage difference between the voltage at the first detection point and the voltage at the second detection point that is detected by the detection unit 101, the processing unit 102 of the BMS10 calculates the voltage difference between the voltage at the first detection point and the voltage at the second detection point. If the voltage difference between the voltage at the first detection point and the voltage at the second detection point is greater than the preset voltage threshold, it is determined that the battery pack 30 fails to connect to the load circuit 40, and the processing unit 102 controls the first switch, the second switch, and the third switch in the switch circuit 20 to maintain turned off. Optionally, after determining that the battery pack 30 fails to connect to the load circuit 40, the processing unit 102 of the BMS10 may send a fault prompt message to the display screen.

This embodiment provides a BMS. When the battery pack is connected to the load circuit, the BMS detects and compares the voltage at the first detection point with the voltage at the second detection point. When a voltage difference between the voltage at the first detection point and the voltage at the second detection point is less than or equal to a preset voltage threshold, the BMS controls a switch circuit to enter a pre-charging mode, and pre-charge a load capacitor in the load circuit through the battery pack. A charging current of the switch circuit in the pre-charging mode is less than a charging current of the switch circuit in a charging mode. The ablation problem when igniting that occur when the battery pack is connected to the load circuit can be avoided by using the foregoing BMS. In addition, it can avoid generation of a large surge current from impacting the switch circuit, and ensure a service life of the switch circuit, thereby improving safety.

It is worth mentioning that each unit involved in this implementation is a logical unit. In practical applications, a logical unit may be a physical unit, a part of a physical unit, or a combination of a plurality of physical units. For example, please refer to FIG. 4, the battery management system includes at least one processor 103 (one processor is taken as an example in FIG. 4); and a memory 104 connected in communication with the at least one processor 103; where the memory 104 stores instructions that may be executed by the at least one processor 103, the instructions are executed by the at least one processor 103, so that the at least one processor 103 can execute the method in the foregoing embodiment.

Figure 4:
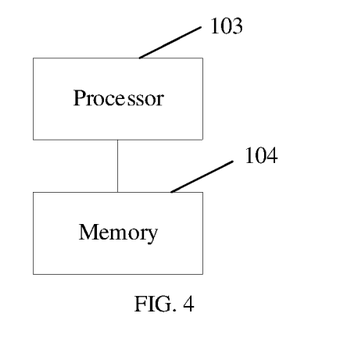
FIG. 4 is a block diagram of a battery management system according to a second implementation of this application.

The processor 103 and the memory 104 may be connected by a bus or in other ways. As a non-volatile computer-readable storage medium, the memory 104 may be used to store non-volatile software programs, non-volatile computer-executable programs, and modules. The processor 103 executes various functional applications and data processing of the device by running non-volatility software programs, instructions, and modules stored in the memory 104, namely, implementing the load access detection method in any of the foregoing method embodiment.

The memory 104 may include a storage program area and a storage data area, where the storage program area may store an operating system and an application program required by at least one function; and the storage data area may store a filter and the like. In addition, the memory 104 may include a high-speed random access memory 104, and may also include a non-volatile memory 104, such as at least one magnetic disk storage device 104, a flash memory device, or other non-volatile solid-state storage devices 104. In some embodiments, optionally, the memory 104 may include memories 104 remotely provided relative to the processor 103, and these remote memories 104 may be connected to an extraneous device through a network. Examples of the network include but are not limited to the Internet, the Intranet, LAN, the mobile communication network and the combinations thereof.

One or more modules are stored in the memory 104, and when the one or more modules are executed by one or more processors 103, the load access detection method in any of the foregoing method embodiments is executed.

The foregoing device may execute the method provided in the embodiments of this application, and has corresponding functional modules and beneficial effects for executing the method. For technical details not described in detail in this embodiment, please refer to the method provided in the embodiments of this application.

A person skilled in the art may understand that all or part of the steps in the foregoing embodiments of the load access detection method may be implemented by instructing relevant hardware based on a program. The program is stored in a storage medium and includes several instructions to enable a device (may be a single-chip microcomputer, a chip, and the like) or a processor to execute all or part of the steps of the method in each embodiment of this application. The foregoing storage media include: a USB flash drive, a removable hard disk, a read-only memory (ROM), a random access memory (RAM), a magnetic disk, an optical disk, or other media that can store program code.

A third embodiment of this application provides a switch circuit (the switch circuit 20 in FIG. 1) that includes a first switch, a second switch, and a third switch. The second switch and the third switch are connected in series through at least one resistor (for example, the second switch and the third switch are connected in series through a resistor R2 in FIG. 1), the first switch is connected in parallel with the second switch, and the first switch is connected in series with the third switch.

The switch circuit is configured to enter a pre-charging mode according to control of a battery management system; and the switch circuit is further configured to pre-charge a load capacitor in the load circuit through the battery pack, where a charging current of the switch circuit in the pre-charging mode is less than a charging current of the switch circuit in a charging mode.

Specifically, the BMS detects a voltage at a first detection point, where the first detection point is electrically connected to a positive electrode of a battery group in a battery pack through a bridging resistor; the BMS detects a voltage at a second detection point, where the second detection point is short-circuited with the first detection point when the battery pack is connected to a load circuit; if a voltage difference between the voltage at the first detection point and the voltage at the second detection point is less than or equal to a preset voltage threshold, the BMS controls a switch circuit to enter a pre-charging mode, and pre-charges a load capacitor in the load circuit through the battery pack.

The switch circuit 20 has three modes, which are respectively: a pre-charging mode, a charging mode, and a discharging mode. Specifically: in the pre-charging mode, the first switch is turned off, and a charging direction of the second switch is turned on, a charging direction of the third switch is turned on; in the charging mode, the second switch is turned off, a charging direction of the first switch is turned on, and the charging direction of the third switch is turned on; and in the discharging mode, the second switch is turned off, a discharging direction of the first switch is turned on, and a discharging direction of the third switch is turned on.

Optionally, the first switch, the second switch, and the third switch of the switch circuit 20 may be metal-oxide-semiconductor field-effect transistors (MOSFET).

In related technologies, the switch circuit usually only includes the first switch and the third switch connected in series, and only has functions of charging and discharging. The first switch and the third switch are usually referred to as charging and discharging switches. For a switch device of the field-effect transistor, the first switch and the third switch may also be referred to as charging and discharging field-effect transistors. Since the charging and discharging field-effect transistor in the battery pack is in a normally closed state, when the battery pack is connected to a vehicle body, ignition and ablation may occur in an interface between a vehicle body base and the battery pack, which is a potential safety hazard. In addition, there will be a large surge current impacting the charging and discharging field-effect transistor, which may affect a service life of the charging and discharging field-effect transistor.

When the battery pack is connected to the load circuit, the BMS detects and compares the voltage at the first detection point with the voltage at the second detection point. When a voltage difference between the voltage at the first detection point and the voltage at the second detection point is less than or equal to a preset voltage threshold, the BMS controls a switch circuit to enter a pre-charging mode, and pre-charge a load capacitor in the load circuit through the battery pack, where a charging current of the switch circuit in the pre-charging mode is less than a charging current of the switch circuit in a charging mode. The ablation problem when igniting that occur when the battery pack is connected to the load circuit can be avoided based on the foregoing switch circuit. In addition, it can avoid generation of a large surge current from impacting the switch circuit, and ensure a service life of the switch circuit, thereby improving safety.

A fourth implementation of this application provides a load access detection system, which includes at least the battery management system 10 and the switch circuit 20 of the foregoing embodiment. Please refer to FIG. 1 for the circuit of the load access detection system, and details are not described herein again.

A person of ordinary skill in the art may understand that the foregoing implementations are specific embodiments for realizing this application, and in actual applications, various changes may be made to them in form and details.

What is claimed is:

1. A load access detection method, comprising:
   detecting a voltage at a first detection point, wherein the first detection point is electrically connected to a positive electrode of a battery group in a battery pack through a bridging resistor;
   detecting a voltage at a second detection point, wherein the second detection point is short-circuited with the first detection point when the battery pack is connected to a load circuit; and
   under a voltage difference between the voltage at the first detection point and the voltage at the second detection point being less than or equal to a preset voltage threshold condition, controlling a switch circuit to enter a pre-charging mode, and pre-charging a load capacitor in the load circuit through the battery pack, wherein a charging current of the switch circuit in the pre-charging mode is less than a charging current of the switch circuit in a charging mode.

2. The load access detection method according to claim 1, wherein the under a voltage difference between the voltage at the first detection point and the voltage at the second detection point being less than or equal to a preset voltage threshold condition, controlling a switch circuit to enter a pre-charging mode, and pre-charging a load capacitor in the load circuit through the battery pack comprises:
   under the voltage difference between the voltage at the first detection point and the voltage at the second detection point being less than or equal to the preset voltage threshold within a first preset period condition, controlling the switch circuit to enter the pre-charging mode, and pre-charging the load capacitor in the load circuit through the battery pack.

3. The load access detection method according to claim 2, wherein the switch circuit comprises a first switch, a second switch, and a third switch, and the method comprises:
- turning off the second switch, turning on a charging direction of the first switch, and turning on a charging direction of the third switch, so as to form the charging mode of the switch circuit; and
- turning off the first switch, turning on a charging direction of the second switch, and turning on the charging direction of the third switch, so as to form the pre-charging mode of the switch circuit; wherein
- the first switch is connected in parallel with the second switch; the first switch is connected in series with the third switch; and the second switch is connected in series with the third switch through at least one resistor.

4. The load access detection method according to claim 1, wherein the switch circuit comprises a first switch, a second switch, and a third switch, and the method comprises:
- turning off the second switch, turning on a charging direction of the first switch, and turning on a charging direction of the third switch, so as to form the charging mode of the switch circuit; and
- turning off the first switch, turning on a charging direction of the second switch, and turning on the charging direction of the third switch, so as to form the pre-charging mode of the switch circuit; wherein
- the first switch is connected in parallel with the second switch; the first switch is connected in series with the third switch; and the second switch is connected in series with the third switch through at least one resistor.

5. The load access detection method according to claim 1, wherein the controlling a switch circuit to enter a pre-charging mode, and pre-charging a load capacitor in the load circuit through the battery pack comprises:
- controlling the switch circuit to maintain the pre-charging mode within a second preset period, and pre-charging the load capacitor through the battery pack.

6. The load access detection method according to claim 1, further comprising:
- determining that an access fault occurs under the voltage difference between the voltage at the first detection point and the voltage at the second detection point being greater than the voltage threshold condition.

7. A battery management system, comprising:
- a detection unit, configured to detect a voltage at a first detection point, wherein the first detection point is electrically connected to a positive electrode of a battery group in a battery pack through a bridging resistor;
- the detection unit is further configured to detect a voltage at a second detection point, wherein the second detection point is short-circuited with the first detection point when the battery pack is connected to a load circuit; and
- a processing unit, configured to control a switch circuit to enter a pre-charging mode, and pre-charge a load capacitor in the load circuit through the battery pack when a voltage difference between the voltage at the first detection point and the voltage at the second detection point is less than or equal to a preset voltage threshold, wherein a charging current of the switch circuit in the pre-charging mode is less than a charging current of the switch circuit in a charging mode.

8. The battery management system according to claim 7, wherein the processing unit is configured to control the switch circuit to enter the pre-charging mode, and pre-charge the load capacitor in the load circuit through the battery pack when the voltage difference between the voltage at the first detection point and the voltage at the second detection point is less than or equal to the preset voltage threshold within a first preset period.

9. The battery management system according to claim 8, wherein the switch circuit comprises a first switch, a second switch, and a third switch, wherein the first switch is connected in parallel with the second switch; the first switch is connected in series with the third switch; and the second switch is connected in series with the third switch through at least one resistor;
- the processing unit is specifically configured to: turn off the first switch, turn on a charging direction of the second switch, and turn on a charging direction of the third switch, so as to form the pre-charging mode of the switch circuit; and
- the processing unit is specifically configured to: turn off the second switch, turn on a charging direction of the first switch, and turn on the charging direction of the third switch, so as to form the charging mode of the switch circuit.

10. The battery management system according to claim 7, wherein the switch circuit comprises a first switch, a second switch, and a third switch, wherein the first switch is connected in parallel with the second switch; the first switch is connected in series with the third switch; and the second switch is connected in series with the third switch through at least one resistor;
- the processing unit is specifically configured to: turn off the first switch, turn on a charging direction of the second switch, and turn on a charging direction of the third switch, so as to form the pre-charging mode of the switch circuit; and
- the processing unit is specifically configured to: turn off the second switch, turn on a charging direction of the first switch, and turn on the charging direction of the third switch, so as to form the charging mode of the switch circuit.

11. The battery management system according to claim 7, wherein the processing unit is configured to control the switch circuit to maintain the pre-charging mode within a second preset period, and pre-charge the load capacitor through the battery pack.

12. The battery management system according to claim 7, wherein the processing unit is further configured to determine that an access fault occurs when the voltage difference between the voltage at the first detection point and the voltage at the second detection point is greater than the voltage threshold.

13. A switch circuit, comprising a first switch, a second switch, and a third switch;
- wherein the first switch is connected in parallel with the second switch, the first switch is connected in series with the third switch, and the second switch is connected in series with the third switch through at least one resistor;
- the switch circuit is configured to enter a pre-charging mode according to control of the battery management system; and
- the switch circuit is further configured to pre-charge a load capacitor in the load circuit through the battery pack, wherein a charging current of the switch circuit in the pre-charging mode is less than a charging current of the switch circuit in a charging mode.

14. The switch circuit according to claim 13, wherein that the switch circuit is configured to enter the pre-charging mode according to control of the battery management system is specifically that:

the first switch is configured to be turned off, a charging direction of the second switch is configured to be turned on, and a charging direction of the third switch is configured to be turned on, so as to form the pre-charging mode of the switch circuit.

15. The switch circuit according to claim 14, wherein the switch circuit is further configured such that:
the second switch is configured to be turned off, a charging direction of the first switch is configured to be turned on, and the charging direction of the third switch is configured to be turned on, so as to form the charging mode of the switch circuit.

16. The switch circuit according to claim 13, wherein the switch circuit is further configured such that:
the second switch is configured to be turned off, a charging direction of the first switch is configured to be turned on, and the charging direction of the third switch is configured to be turned on, so as to form the charging mode of the switch circuit.

17. A load access detection method, wherein the method is applied to the switch circuit according to claim 13, and the method comprises:
entering, by the switch circuit, a pre-charging mode according to control of a battery management system;
pre-charging, by the switch circuit, a load capacitor in a load circuit through a battery pack, wherein
a charging current of the switch circuit in the pre-charging mode is less than a charging current of the switch circuit in a charging mode; and
the entering, by the switch circuit, a pre-charging mode according to control of a battery management system comprises:
controlling, by the battery management system, the switch circuit to enter the pre-charging mode under a voltage difference between a voltage at a first detection point and a voltage at a second detection point being less than or equal to a preset voltage threshold condition;
detecting, by the battery management system, the voltage at the first detection point, wherein the first detection point is electrically connected to a positive electrode of a battery group in a battery pack through a bridging resistor; and
detecting, by the battery management system, the voltage at the second detection point, wherein the second detection point is short-circuited with the first detection point when the battery pack is connected to a load circuit.

18. The load access detection method according to claim 17, wherein the controlling, by the battery management system, the switch circuit to enter the pre-charging mode comprises:
under the control of the battery management system, turning off, by the switch circuit, the first switch, and turning on a charging direction of the second switch and a charging direction of the third switch, so as to form the pre-charging mode of the switch circuit.

19. The load access detection method according to claim 17, wherein the method further comprises:
under the control of the battery management system, turning off, by the switch circuit, the second switch, and turning on a charging direction of the first switch and the charging direction of the third switch, so as to form the charging mode of the switch circuit.

20. A load access detection system, comprising the battery management system according to claim 7, and the load access detection system further comprises:
a switch circuit, comprising a first switch, a second switch, and a third switch;
wherein the first switch is connected in parallel with the second switch, the first switch is connected in series with the third switch, and the second switch is connected in series with the third switch through at least one resistor;
the switch circuit is configured to enter a pre-charging mode according to control of the battery management system; and
the switch circuit is further configured to pre-charge a load capacitor in the load circuit through the battery pack, wherein a charging current of the switch circuit in the pre-charging mode is less than a charging current of the switch circuit in a charging mode.

* * * * *